United States Patent
Vendier et al.

(10) Patent No.: US 9,108,277 B2
(45) Date of Patent: Aug. 18, 2015

(54) PROCESS FOR MANUFACTURING A DEVICE COMPRISING BRAZES PRODUCED FROM METAL OXALATE

(75) Inventors: Olivier Vendier, Lacroix-Falgarde (FR); Lidwine Raynaud, Saint-Sulpice (FR); Valérie Baco, Labarthe sur Leze (FR); Michel Gougeon, Toulouse (FR); Hoa Le Trong, Ho Chi Minh (VN); Philippe Tailhades, Saint-Orens (FR)

(73) Assignees: THALES, Courbevoie (FR); UNIVERSITE PAUL SEBATIER TOULOUSE III, Toulouse (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 13/539,239

(22) Filed: Jun. 29, 2012

(65) Prior Publication Data

US 2013/0001275 A1    Jan. 3, 2013

(30) Foreign Application Priority Data

Jun. 30, 2011 (FR) .................................... 11 02036

(51) Int. Cl.
*B23K 35/00* (2006.01)
*B23K 1/00* (2006.01)
(Continued)

(52) U.S. Cl.
CPC ........... *B23K 35/3618* (2013.01); *B23K 1/0016* (2013.01); *B23K 35/02* (2013.01); *B23K 35/025* (2013.01); *B23K 35/30* (2013.01); *B23K 35/3006* (2013.01); *B23K 35/36* (2013.01); *B23K 35/3616* (2013.01); *H01L 24/27* (2013.01); *H01L 24/29* (2013.01); *H01L 24/83* (2013.01); *H01L 2224/29339* (2013.01); *H01L 2224/29347* (2013.01); *H01L 2224/83191* (2013.01); *H01L 2224/83192* (2013.01); *H01L 2224/83193* (2013.01);

(Continued)

(58) Field of Classification Search
CPC ....................................................... B23K 35/04
USPC ............................ 228/121, 122.1, 203, 248.1
See application file for complete search history.

(56) References Cited

U.S. PATENT DOCUMENTS

| 4,463,030 A * | 7/1984 | Deffeyes et al. .............. 427/216 |
| 4,662,952 A | 5/1987 | Barringer et al. |
| 7,345,342 B2 * | 3/2008 | Challa et al. .................. 257/341 |
| 2003/0148024 A1 | 8/2003 | Kodas et al. |

(Continued)

FOREIGN PATENT DOCUMENTS

| GB | 294880 A | 8/1929 |
| JP | 49-17353 A | 2/1974 |
| SU | 1687407 A1 | 10/1991 |

OTHER PUBLICATIONS

Sam Barros, "Powerlabs Oxalate Explosive Synthesis", Internet URL:http://www.powerlabs.org/chemlabs/silver_oxalate.htm, Dec. 1, 2003, XP002669676.

*Primary Examiner* — Devang R Patel
(74) *Attorney, Agent, or Firm* — Baker & Hostetler LLP

(57) ABSTRACT

A process for manufacturing a device comprising at least a support and a component, joined together by at least one braze, includes a brazing operation which is carried out starting from a metal oxalate. Advantageously, it is a silver oxalate or a mixture of silver and copper oxalates, the component and/or the support being covered with a film comprising gold or copper in contact with said braze and the component possibly being a power component.

15 Claims, 2 Drawing Sheets

(51) Int. Cl.
*B23K 35/36* (2006.01)
*B23K 35/02* (2006.01)
*B23K 35/30* (2006.01)
*H01L 23/00* (2006.01)

(52) U.S. Cl.
CPC ............... *H01L 2224/83801* (2013.01); *H01L 2924/013* (2013.01); *H01L 2924/01322* (2013.01); *H01L 2924/01327* (2013.01); *H01L 2924/1033* (2013.01); *H01L 2924/10272* (2013.01); *H01L 2924/10329* (2013.01)

(56) References Cited

U.S. PATENT DOCUMENTS

2005/0142839 A1   6/2005   Houng et al.
2011/0013366 A1*  1/2011   Coppola et al. ............... 361/720

\* cited by examiner

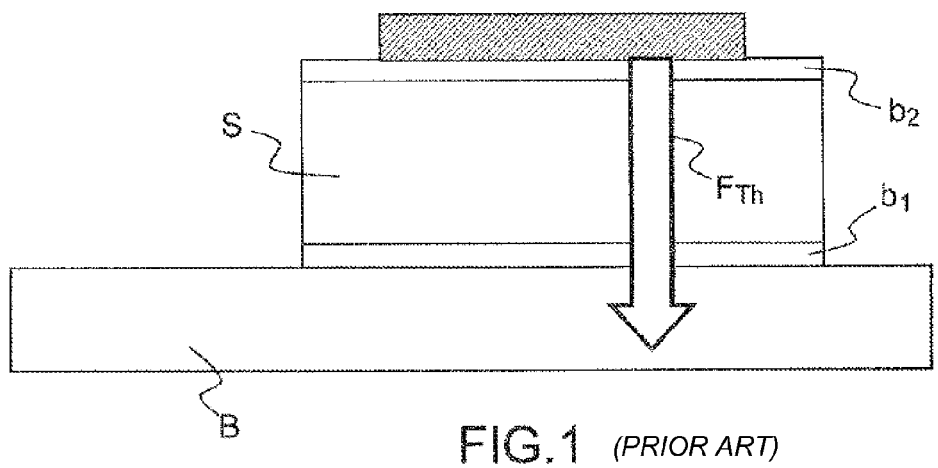
FIG.1 *(PRIOR ART)*
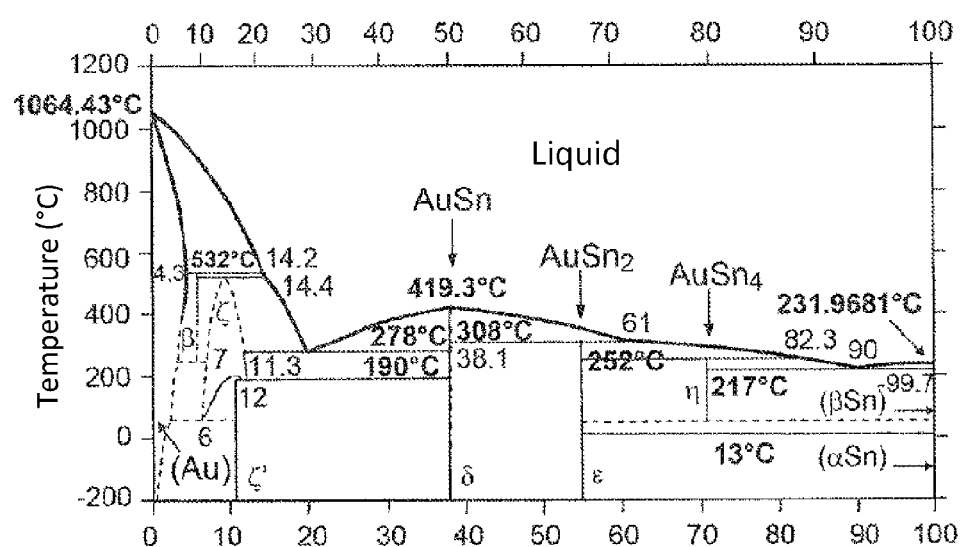
FIG.2 *(PRIOR ART)*

PROCESS FOR MANUFACTURING A DEVICE COMPRISING BRAZES PRODUCED FROM METAL OXALATE

CROSS-REFERENCE TO RELATED APPLICATION

This application claims priority to foreign French patent application No. FR 1102036, filed on Jun. 30, 2011, the disclosure of which is incorporated by reference in its entirety.

FIELD OF THE INVENTION

The field of the invention is that of metal interfaces of braze type for power components that may notably be based on GaAs, GaN or SiC, and that may, for example, be loaded on board satellites and therefore potentially subjected to high temperatures and high pressures.

BACKGROUND

FIG. 1 illustrates an example of a power component comprising a package bottom B, two brazes $b_1$ and $b_2$ on either side of a support S enabling the removal of the thermal energy produced by the electronic component, the braze $b_2$ being in contact with the power component $C_{omp}$, gold finishes being necessary that ensure quality electrical and thermal contacts that are stable from a chemical viewpoint, the arrow $F_{Th}$ indicating the direction of the heat flow generated during the operation of the component $C_{omp}$.

Certain brazing processes use alloys that have a low melting point. However, these alloys have various drawbacks:
- mediocre mechanical properties linked to the formation of intermetallic species and to an uneven coverage of the surfaces to be assembled (case of Au—Sn-based brazes);
- a poor temperature resistance (case of Ag—Sn, Cu—Sn and AuSn brazes), if it is assumed that the temperatures of the base have a tendency to increase with components of GaN type;
- an excessively high reactivity with the finishing layers comprising notably gold positioned on the surface of the parts to be assembled (case of In—Sn).

Furthermore, the current gold-based or silver-based brazes which could have a very good thermal conductivity and advantageous mechanical properties, are difficult to implement considering their melting point, as shown in FIG. 2, which provides the melting points of certain gold-based eutectics, showing that the latter are very high, thereby giving rise to difficult processing.

Similarly, commercial silver-based nanoscale inks and/or pastes have already been proposed, which have low melting points, typically below 300° C., notably for the production of conductors on plastic substrates. These inks and/or pastes are nevertheless not compatible with the power components notably addressed in the present invention, since they have high porosities and therefore poor resistances to high pressures.

SUMMARY OF THE INVENTION

In this context, the subject of the present invention is an original process for producing brazes that are compatible with deposits of gold and that ensure both a very good thermal conductivity at the same time as a very good resistance to high pressures.

The fundamental idea of the present invention consists in providing the brazing metal via a metal oxalate, the decomposition temperature of which is low. During its thermal decomposition, the oxalate generates nanoscale metallic clusters or particles, the melting temperature of which is lower than that of the metal in the bulk state. These particles, which furthermore have a very large surface/volume ratio, consequently have a high propensity to sintering. This characteristic is favorable to the brazing operation and remains compatible with "dispensing/pick&place" production means corresponding to a localized coating.

In the case of silver oxalate or a mixture of silver and copper oxalates, the decomposition is highly exothermic. The local energy input enables an increase in temperature beyond the brazing temperature applied to all of the parts to be assembled. Since the provision of energy is local and of very short duration, it helps to facilitate the sintering or even the melting of the metal generated, without however degrading the electronic components to be brazed.

The control of the size and shape of the oxalate particles and also the quality of the dispersion of the latter in the paste to be brazed, moreover helps to form homogeneous and crack-free brazes.

More specifically, the subject of the present invention is a process for manufacturing a device comprising at least a support and a component, joined together by at least one braze characterized in that the brazing operation is carried out starting from a metal oxalate. The metal oxalate is obtained by chemical precipitation of a soluble metal salt, by oxalic acid or ammonium oxalate, dissolved in aqueous-alcoholic solvents preferably having dielectric constants between 17 and 80.

Particles of small size may be obtained preferably when these solvents have low dielectric constants and when the concentrations of the two solutions are high or even close to saturation.

According to one variant of the invention, the oxalate is a silver oxalate or a mixture of silver and copper oxalates.

According to one variant of the invention, the component and/or the support comprise, at the surface, a film comprising gold or copper on which said braze is produced.

According to one variant of the invention, the braze is produced from a suspension containing metal oxalate.

According to one variant of the invention, the braze is produced from a paste containing metal oxalate.

It should be noted that the suspension is characterized by a lower oxalate content and a lower viscosity than the paste and is preferably used for producing thin brazes.

According to one variant of the invention, the brazing operation further comprises the following steps:
- the production of a suspension or of a paste, to be brazed containing metal oxalate;
- the deposition of said suspension or of said paste on the surface of said support and/or of said component;
- the assembling of the support and of the component via said suspension or said paste;
- the heating of the preconstituted assembly.

According to one variant of the invention, the production of said suspension or of said paste comprises the following steps:
- the chemical precipitation, in an aqueous or aqueous-alcoholic medium, of a soluble metal salt by oxalic acid or a soluble oxalate;
- obtaining an oxalate precipitate having controlled particle size and morphological characteristics resulting in particle sizes of greater than around 40 nm for the oxalate mixture comprising copper and silver and around 0.1 micron for the silver oxalate;

washing of the precipitate formed;

putting the oxalate into suspension in an aqueous or aqueous-alcoholic medium at a chosen concentration in order to obtain a suspension or a paste of controlled viscosity.

According to one variant of the invention, the oxalate-based suspension is deposited by spraying.

According to one variant of the invention, the oxalate-based suspension is deposited by inkjet.

According to one variant of the invention, the oxalate-based paste is deposited by coating.

According to one variant of the invention, the oxalate-based paste is deposited by screen printing.

According to one variant of the invention, the process comprises a step of drying the deposit of said suspension or of said paste before the assembling of the support and component, via said suspension or said paste based on metal oxalate.

According to one variant of the invention, the drying step is carried out at a temperature of around 100° C. in air or under primary vacuum or by a freeze drying process.

According to one variant of the invention, the heating of the assembly is carried out at a temperature of around 200° C.

According to one variant of the invention, the heating of the assembly is carried out at a heating rate greater than around 150° C./h.

According to one variant of the invention, the component is a power component, which may notably be based on GaAs, GaN or SiC.

BRIEF DESCRIPTION OF THE DRAWINGS

The invention will be better understood and other advantages will become apparent on reading the following description given nonlimitingly and owing to the appended figures, among which:

FIG. 1 illustrates an example of a power component joined via brazes to a package bottom;

FIG. 2 illustrates the melting points of various gold-based eutectics;

DETAILED DESCRIPTION

Figure 3:
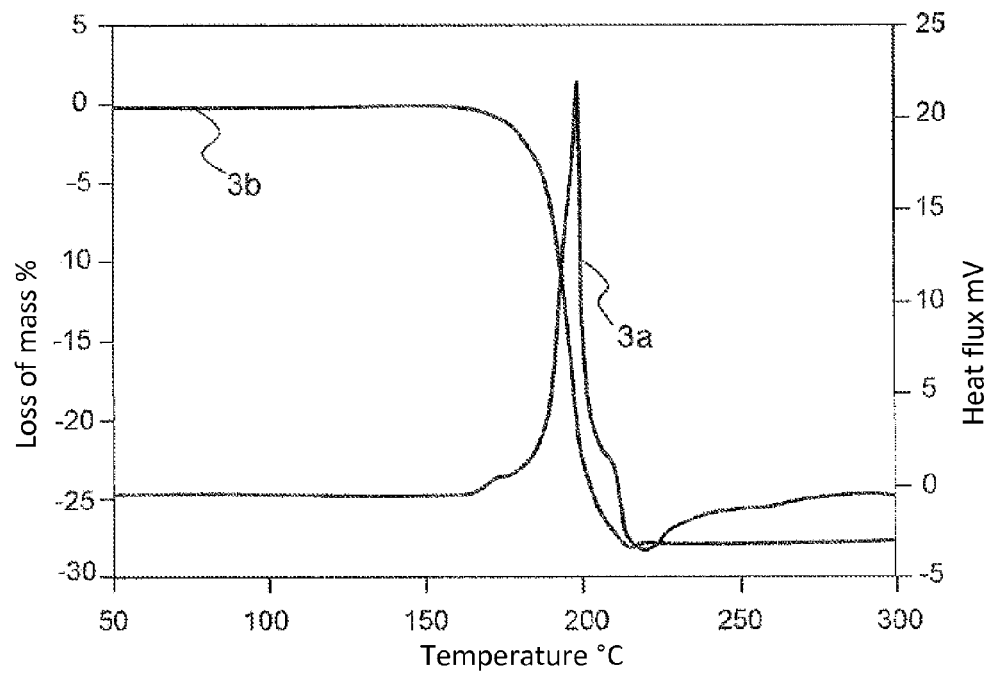
FIG. 3 illustrates the decomposition curve of the silver oxalate as a function of the temperature.

The process of the present invention comprises the production of a braze based on metal oxalate, which may advantageously be silver oxalate $Ag_2C_2O_4$ or a mixture of silver oxalate $Ag_2C_2O_4$ and copper oxalate $CuC_2O_4$, in order to manufacture a device comprising, notably, a component to be assembled on a support, which may be, for example, the package bottom illustrated in FIG. 1.

The various steps of an example of the process according to the invention will be described below.

First Step: Production of the Suspension or of the Paste to be Brazed

The chemical precipitation of a soluble silver or copper salt by oxalic acid or a soluble oxalate is carried out under controlled conditions in an aqueous or aqueous-alcoholic medium.

For this, it is possible for the examples described below to be followed:

Example 1

Silver oxalate is produced by precipitation by oxalic acid in water (powder P1) starting from a solution A of 25.480 g of silver nitrate $AgNO_3$ dissolved in 150 ml of distilled water and from a solution B of 47.276 g of oxalic acid $H_2C_2O_4.2H_2O$ dissolved in 750 ml of distilled water stirred by a blade rotating at 250 rpm.

The salt solution A is introduced into the oxalic solution at a controlled rate using peristaltic pumps (v=30 ml/min). The points for addition of the salt solution are dispersed on the surface of the oxalic solution.

When all the silver solution has been added, the stirring is maintained for 30 minutes.

Washing operations are then carried out:

The suspension obtained at the end of the precipitation is then centrifuged in order to separate the precipitate from the mother liquors:

the precipitate recovered is put back into suspension in distilled water for 30 min, washed with distilled water in order to remove the nitrate ions. The washing is repeated at least 4 times;

for the last washing, the water is replaced by 95% ethanol;

the precipitate obtained at the end of a final centrifugation is dried in an oven at 60° C. for 48 h. After disintegration, the oxalate powder P1 is obtained.

The particles of silver oxalate obtained by this process have the shape of rods having a length of 5 to 10 μm and having a diameter of 2 to 5 μm.

The silver oxalate prepared is preferably stored in the dark to prevent its conversion.

Example 2

The silver oxalate is prepared according to a protocol similar to that presented in Example 1, but the water of the solution A is replaced by 150 ml of ethylene glycol.

Likewise, in the solution B, 750 ml of butanol are used instead of the distilled water in order to dissolve 47.276 g of oxalic acid $H_2C_2O_4.2H_2O$.

The precipitate is recovered according to a protocol identical to that described in Example 1.

The particles of silver oxalate (powder P2) thus prepared have a size in the vicinity of 0.5 to 1 micron. They are also stored in the dark.

Example 3

Copper oxalate is produced by precipitation by oxalic acid (powder P3) starting from a solution A of 24.16 g of copper nitrate $Cu(NO_3)_2.3H_2O$ dissolved in a mixture consisting of 5 ml of water and 25 ml of ethanol and from a solution B of 13.48 g of oxalic acid $H_2C_2O_42H_2O$ dissolved in 200 ml of pentanol stirred by a blade rotating at 250 rpm.

The salt solution A is introduced into the oxalic solution at a controlled rate using peristaltic pumps (v=60 ml/min). The points for addition of the salt solution are dispersed at the surface of the oxalic solution.

When all the copper solution has been added, the stirring is maintained for 20 minutes.

Washing operations are then carried out:

The suspension obtained at the end of the precipitation is then centrifuged in order to separate the precipitate from the mother liquors. The precipitate recovered is put back into suspension in distilled water for 30 minutes, washed with distilled water in order to remove the nitrate ions. The washing is repeated only 2 times because the suspension obtained at the end of the second washing remains stable. The powder P3 can be kept in suspension in water or be extracted from the suspension then dried at 80° C. for several hours.

The copper oxalate particles which make up the powder P3 have the shape of grains of rice having a size of less than 50 nm.

Thus precipitates of silver oxalate or copper oxalate are obtained that have controlled particle size and morphological characteristics. The gradual addition of the solution A to the solution B helps to obtain a relatively narrow particle size distribution and the use of solvents having dielectric constants lower than that of water contributes to the formation of particles of submicron sizes. High concentrations for the solutions A and B are also favorable to obtaining small particles.

The oxalate is then put into suspension in an aqueous or aqueous-alcoholic medium (for example in ethylene glycol and water) at a chosen concentration, in order to obtain a suspension or a paste.

Using an agate mortar, a mass of 5 g of powder P1, the production of which was described in Example 1, is mixed with 5 g of ethylene glycol. A paste S1 is then obtained, which may be used with a view to producing silver brazes according to the protocol described further on.

A paste S2 may also be prepared according to the same protocol as above using the powder P2.

Using an agate mortar, a mass of 5 g of powder P2, the production of which was described in Example 2, is mixed with 25 g of ethylene glycol. A suspension S3 is then obtained, which may be used with a view to producing silver brazes according to the protocol described further on.

Using an agate mortar, a mass of 15 g of powder P2 and of 5 g of powder P3, the production of which was described in Examples 2 and 3, is mixed with 40 g of ethylene glycol. A suspension S4 is then obtained which may be used with a view to producing silver-copper brazes according to the protocol described further on.

Using an agate mortar, a mass of 13.4 g of powder P2 and of 6.6 g of powder P3, the production of which was described in Examples 2 and 3, is mixed with 40 g of ethylene glycol. A suspension S5 is then obtained which may be used with a view to producing silver-copper brazes according to the protocol described further on.

Second Step: Use of the Suspension or of the Paste:

The suspension to be brazed is deposited, for example by spraying, inkjet method, brush application, etc., or the paste to be brazed is deposited, for example by coating or screen printing, on the component or its support.

It is then dried in air or under primary vacuum at a temperature below 100° C.

Next, the following assembly: component/suspension or paste to be brazed/support of the oxalate-covered element is brought into contact with the second part in order to carry out the assembling process.

It is also possible to coat the faces both of the component and of the support in order to bring into contact two oxalate-based layers.

Third Step: Production of the Braze:

Finally, the braze is produced by a rapid heating, typically at a heating rate greater than around 150° C./h and up to a temperature above 200° C. During this step, a light pressure may be applied to the parts to be assembled, in order to facilitate the densification of the braze in the process of being formed.

Three examples 3, 4 and 5 for the production of a braze are give below:

Example 3

A thickness of around 200 μm of paste (S2) is deposited on a 4 mm×4 mm gold substrate. The paste is then dried under primary vacuum at ambient temperature for 2 h. After drying, the substrate is covered with a second gold part in order to carry out the assembling process.

A small load placed on the second part makes it possible to apply a pressure of 3000 g/cm². The assembly is placed in an oven where heating is carried out at 150° C./h up to 300° C. in order to produce the braze. The thickness of the silver metal layer obtained between the two parts is of the order of 100 μm.

The application of a sheer stress of greater than 40 N is then necessary in order to separate the parts assembled by the braze.

Example 4

A thickness of around 200 μm of paste (S2) is deposited on a 4 mm×4 mm a very clean copper substrate. The paste is then dried under primary vacuum at ambient temperature for 2 h. After drying, the substrate is covered with a second freshly cleaned copper part in order to carry out the assembling process.

A small load placed on the second part makes it possible to apply a pressure of 3000 g/cm². The assembly is placed in an oven under a neutral atmosphere ($N_2$ or Ar) purged of oxygen in order to prevent oxidation of the copper support, in which heating is carried out at 150° C./h up to 300° C. in order to produce the braze. The thickness of the silver metal layer obtained between the two parts is of the order of 100 μm.

Example 5

A thickness of around 200 μm of suspension (S4) is deposited on a 4 mm×4 mm gold substrate. The suspension is then dried under primary vacuum at ambient temperature for 2 h. After drying, the substrate is covered with a second gold part in order to carry out the assembling process.

A small load placed on the second part makes it possible to apply a pressure of 3000 g/cm². The assembly is placed in an oven where heating is carried out at 150° C./h up to 300° C. in order to produce the braze. The thickness of the metallic silver and copper layer obtained between the two parts is of the order of 100 μm.

Example 6

A thickness of around 200 μm of suspension (S5) is deposited on a 4 mm×4 mm gold substrate. The suspension is then dried under primary vacuum at ambient temperature for 2 h. After drying, the substrate is covered with a second gold part in order to carry out the assembling process.

A small load placed on the second part makes it possible to apply a pressure of 3000 g/cm². The assembly is placed in an oven in which heating is carried out at 150° C./h up to 300° C. in order to produce the braze. The thickness of the metallic silver and copper layer obtained between the two parts is of the order of 100 μm.

The technical advantages of the proposed brazing material are linked to its ability to produce, from 200° C. onwards, a bond of high thermal conductivity between electronic components and their support. This material offers the only current possibility of correctly brazing electronic components of highly dissipative power, intended for spatial applications. It may however find other applications in the field of microelectronics. The characteristics and performances of the proposed material result from:

the local heat gain due to the decomposition of the silver oxalate (facilitation of sintering), as shown in FIG. 3 which illustrates the heat flux generated as a function of the temperature in curve 3a, the curve 3b relating to the loss of mass;

the formation of low melting point silver nanoparticles in the first stages of the decomposition facilitates the sintering;

the control of the size, morphology and particle size dispersion of the oxalates ensures a homogeneity of the braze and the absence of cracking.

Thermal conductivities for silver-based brazes, of greater than 100 Wm$^{-1}$K$^{-1}$, may typically be achieved.

The thermal current or heat flux that flows through the braze from the interface with the dissipative component toward the support also commonly referred to as the baseplate, is of the form:

$$\phi = \frac{-dQ}{dt} = \frac{-(K \cdot A \cdot \Delta T)}{s}$$

with:
−dQ/dt: amount of heat flowed per unit time from the hot section to the cold section;
K: thermal conductivity of the braze;
A: surface area of the braze perpendicular to the heat flux;
ΔT: positive temperature difference between the (hot) dissipative component and the (cold) baseplate;
S: thickness of the braze.

Since the baseplate consists of a solid material having a thermal conductivity greater than that of the braze, the latter limits the flow of the heat, and therefore the cooling of the component. It results from the expression of the flux, that the thickness of the braze must be as low as possible in order to facilitate the heat flow, that is to say for ϕ to be large.

In practice, in order to assemble two parts (component+baseplate) while avoiding leaving empty spaces (with no braze) that are prejudicial to a good conductivity and a good homogeneity of temperature over the surface of the component, it is advisable to insert a brazing material of sufficient thickness in order to "correct" the surface defects or planarity defects of the component and of the baseplate. If the brazing material is simply melted or sintered without a significant loss of material occurring, the thickness of the latter varies little before and after the heat treatment necessary for the brazing. Only the optional elimination of the initial porosity can be responsible for this variation. In the case of silver oxalate or a mixture of silver and copper oxalates on the other hand, the thermal decomposition which occurs during brazing may be described by the following chemical reaction:

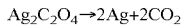

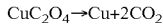

the mass balance of which, linked to the loss of carbon dioxide, is given by FIG. 3 and notably by the curve 3b, the curve 3a relating to the heat flux emitted.

Knowing, furthermore, that the molar masses and densities are respectively 259.8 g·mol$^{-1}$ and 5 g·cm$^3$ for silver oxalate and 215.8 g·mol$^{-1}$ and 10.5 g·cm$^3$ for silver metal, it appears that the decomposition of a perfectly dense grain of oxalate to a metal grain that is itself also free of porosity, divides the initial volume by around 2.5.

Knowing, furthermore, that the molar masses and densities are respectively 151.5 g·mol$^{-1}$ and 3.5 g·cm$^3$ for copper oxalate and 63.5 g·mol$^{-1}$ and 8.96 g·cm$^3$ for copper metal, it appears that the decomposition of a perfectly dense grain of oxalate to a metal grain that is itself also free of porosity, divides the initial volume by around 6.

In the case of a silver oxalate or a mixture of silver and copper oxalates, a large decrease in the thickness may therefore be expected during the brazing operation and may result, advantageously, in very thin brazes having a very low thermal resistance being obtained.

Finally it should be noted that oxalates (silver and copper oxalates in particular) do not exhibit any specific toxicity problem. After decomposition, a layer of pure Ag is obtained with no risk of pollution for the environment.

Figure 4:
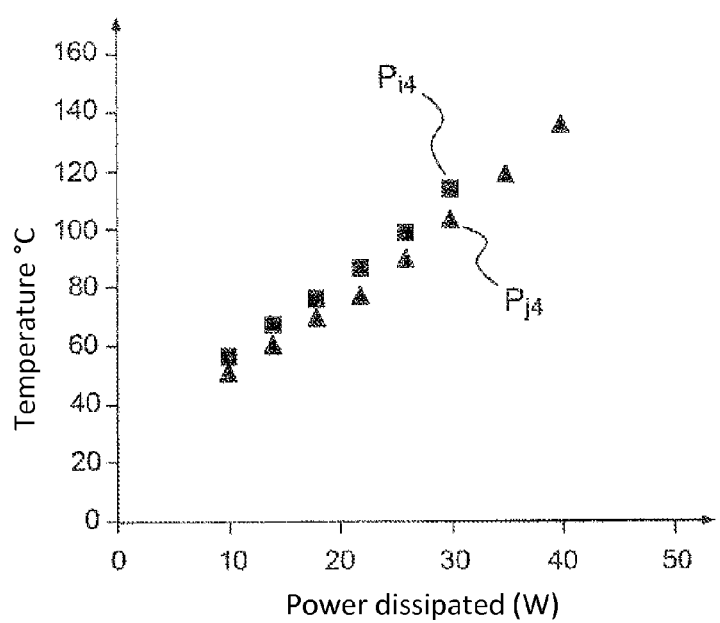
FIG. 4 illustrates the power dissipated as a function of the temperature in the case of a conventional braze and in the case of a braze produced according to the invention.

The applicant has furthermore compared the temperature, for a given power, achieved by a component comprising a braze of the prior art based on gold and tin AuSn (all of the points $P_{i4}$ from FIG. 4) and a component comprising a braze according to the invention originating from the decomposition of an oxalate (all of the points $P_{j4}$ from FIG. 4). It thus appears that the component based on a braze according to the invention achieves a lower temperature, it is therefore better cooled. The type of braze of the present invention therefore enables a better heat removal.

The invention claimed is:

1. A process for manufacturing a device comprising at least one support and at least one component, comprising:
   precipitating a soluble metal salt by oxalic acid or ammonium oxalate to obtain a metal oxalate;
   dissolving the metal oxalate in an aqueous-alcoholic solvent to obtain at least one of a suspension and a paste;
   heating an assembly of the at least one support and the at least one component at a heating rate greater than around 150° C./h; and
   joining the at least one support and the at least one component by brazing with the at least one of a suspension and a paste, wherein the metal oxalate generates nanoscale metallic particles, wherein a melting temperature of the nanoscale metallic particles is lower than a melting temperature of the metal in a bulk state.

2. The process for manufacturing a device as claimed in claim 1,
   wherein the aqueous-alcoholic solvent has a dielectric constant between 17 and 80, and
   wherein the oxalate is a silver oxalate or a mixture of silver and copper oxalates.

3. The process for manufacturing a device as claimed in claim 1, wherein at least one surface of any of the at least one component and the at least one support comprises a film comprising gold or copper wherein the brazing is carried out on the surface.

4. The process for manufacturing a device as claimed in claim 1, wherein the at least one of a suspension and a paste comprises a suspension comprising the metal oxalate.

5. The process for manufacturing a device as claimed in claim 1, wherein the at least one of a suspension and a paste comprises a paste comprising the metal oxalate.

6. The process for manufacturing a device as claimed in claim 1, further comprising:
   producing the at least one of a suspension and a paste comprising the metal oxalate;
   depositing the at least one of a suspension and a paste on at least one surface of any of the at least one support and the at least one component;
   assembling the at least one support and the at least one component via the at least one of a suspension and a paste to form a preconstituted assembly; and
   heating the preconstituted assembly.

7. The process for manufacturing a device as claimed in claim 6, further comprising:

chemically precipitating, in an aqueous or aqueous-alcoholic medium, the soluble metal salt by oxalic acid or a soluble oxalate;

forming an oxalate precipitate having controlled particle size and morphological characteristics resulting in particle sizes of greater than 40 nm for the oxalate comprising copper and around 0.1 micron for the silver oxalate;

washing the precipitate formed;

putting the oxalate into suspension in an aqueous or aqueous-alcoholic medium at a chosen concentration in order to obtain a suspension or a paste of controlled viscosity.

8. The process for manufacturing a device as claimed in claim 1, further comprising: spraying the at least one of a suspension and a paste on at least one surface of any of the at least one support and the at least one component.

9. The process for manufacturing a device as claimed in claim 1, further comprising: depositing the at least one of a suspension and a paste on at least one surface of any of the at least one support and the at least one component by inkjet.

10. The process for manufacturing a device as claimed in claim 1, further comprising: depositing the at least one of a suspension and a paste on at least one surface of any of the at least one support and the at least one component by coating.

11. The process for manufacturing a device as claimed in claim 1, further comprising: depositing the at least one of a suspension and a paste on at least one surface of any of the at least one support and the at least one component by screen printing.

12. The process for manufacturing a device as claimed in claim 11, further comprising: drying the deposit of the at least one of a suspension and a paste before assembling the at least one support and the at least one component.

13. The process for manufacturing a device as claimed in claim 12, further comprising: carrying out the drying at a temperature of around 100° C. in air or under primary vacuum.

14. The process for manufacturing a device as claimed in claim 1, further comprising: heating an assembly of the at least one support and the at least one component at a temperature of around 200° C.

15. The process for manufacturing a device as claimed in claim 1, wherein the at least one component is a power component comprising GaAs, GaN or SiC.

* * * * *

UNITED STATES PATENT AND TRADEMARK OFFICE
CERTIFICATE OF CORRECTION

PATENT NO. : 9,108,277 B2
APPLICATION NO. : 13/539239
DATED : August 18, 2015
INVENTOR(S) : Olivier Vendier et al.

It is certified that error appears in the above-identified patent and that said Letters Patent is hereby corrected as shown below:

On the title page item (73), in the Assignee information:

Please replace "UNIVERSITE PAUL SEBATIER TOULOUSE III" with --UNIVERSITE PAUL SABATIER TOULOUSE III--.

Signed and Sealed this
Sixteenth Day of August, 2016

Michelle K. Lee
*Director of the United States Patent and Trademark Office*